United States Patent [19]
ElHatem et al.

[11] Patent Number: 5,739,582
[45] Date of Patent: Apr. 14, 1998

[54] METHOD OF PACKAGING A HIGH VOLTAGE DEVICE ARRAY IN A MULTI-CHIP MODULE

[75] Inventors: Abdul M. ElHatem, Redondo Beach, Calif.; Hung C. Nguyen, Webster, N.Y.; Mohammad Mojarradi, Pullman, Wash.

[73] Assignee: Xerox Corporation, Stamford, Conn.

[21] Appl. No.: 562,614

[22] Filed: Nov. 24, 1995

[51] Int. Cl.$^6$ .................. H01L 23/495; H01L 23/34
[52] U.S. Cl. .................. 257/676; 257/701; 257/725; 257/783; 361/813; 361/820
[58] Field of Search .................. 257/676, 687, 257/725, 701, 782, 783; 361/813, 820

[56] References Cited

U.S. PATENT DOCUMENTS

| | | | |
|---|---|---|---|
| 4,466,181 | 8/1984 | Takishima | 257/725 |
| 4,989,063 | 1/1991 | Kolesar, Jr. | 257/725 |
| 5,559,363 | 9/1996 | Immorlica, Jr. | 257/725 |
| 5,572,065 | 11/1996 | Burns | 257/725 |
| 5,625,235 | 4/1997 | Takiar | 257/725 |

*Primary Examiner*—Tom Thomas
*Assistant Examiner*—David Ostrowski
*Attorney, Agent, or Firm*—Nola Mae McBan

[57] ABSTRACT

A method in which several high voltage chips may be packaged within a single, typically low voltage plastic package. The high voltage chips are packaged to remain electrically isolated from each other to avoid undesirable side effects such as arcing between the chips but able to share electronic data and communicate with each other electronically through their input and ouput nodes. Due to the unique packaging method, the typically low voltage plastic packaging can be made to withstand operating voltages up to 35 times greater than previously attained by such low voltage plastic packaging.

13 Claims, 1 Drawing Sheet

METHOD OF PACKAGING A HIGH VOLTAGE DEVICE ARRAY IN A MULTI-CHIP MODULE

BACKGROUND

This invention relates generally to packaging high voltage devices and more particularly concerns assembling an array of high voltage devices within a conventional lead frame package.

Using conventional techniques a typical low voltage integrated circuit chip can be packaged in standard plastic packaging. One such package, an 8-pin dual in-line package can accommodate standard low voltage integrated circuit devices running at voltages of 5 volts to 500 volts. This package can also be used to house several low voltage chips using conventional multi-chip packaging techniques. However, it has not been possible to use the package to house several high voltage devices due to the non-trivial problem of arcing between chips.

Due to the problem of arcing between high voltage chips, high voltage devices have been typically packaged using only single chips within a package and limiting voltages of high voltage parts to 1000 volts when using plastic dual in-line packaging. If voltages greater than 1000 volts are needed then typically a single chip is packaged in several large metal packages, such as T03 and T05 packages, which use the package substrate as an electrode and glass for isolation between high voltage nodes of the chip.

These types of packaging architectures cost more and require large portions of board real estate area when the packages are mounted on a circuit board because each high voltage component must be packaged separately and because large creepage and clearance distances must be maintained between unpotted high voltage components.

Accordingly, it is the primary aim of the invention to provide a method of packaging an array of high voltage chips within a conventional plastic package that extends the voltage capability of the conventional plastic package to 35,000 volts while utilizing present standard packaging techniques.

Further advantages of the invention will become apparent as the following description proceeds.

SUMMARY OF THE INVENTION

Briefly stated and in accordance with the present invention, there is provided a method of packaging high voltage chips in a low voltage package by using a chip front face coating of Hipec Gel, a chip backside coating of polyimide and a non-conductive epoxy on the packaging lead frame that allows the low voltage packaging to sustain operation voltages at least 35 times greater than normally could be achieved in a single low voltage package.

Figure 1:
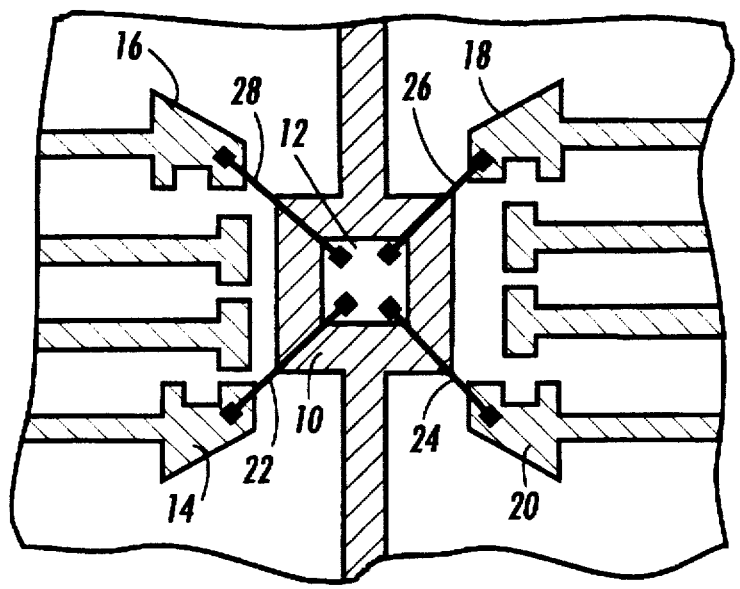
FIG. 1 shows a top view of a conventional prior art packaging of a high voltage device in a plastic eight, dual in line pin package.

While the present invention will be described in connection with a preferred embodiment and method of use, it will be understood that it is not intended to limit the invention to either that embodiment or procedure. On the contrary, it is intended to cover all alternatives, modifications and equivalents as may be included within the spirit and scope of the invention as defined by the appended claims.

Alpha-Numeric List of Elements
cavity 10
chip 12
bonding pad 14
bonding pad 16
bonding pad 18
bonding pad 20
bonding lead 22
bonding lead 24
bonding lead 26
bonding lead 28
cavity 30
chip 32
chip 34
chip 36
chip 38
bonding wire 40
bonding wire 42
bonding wire 44
bonding wire 46
bonding wire 48
bonding wire 50
bonding wire 52
bonding wire 54
bonding wire 56
bonding wire 58
bonding pad 60
bonding pad 62
bonding pad 64
bonding pad 66
polyimide 68
die coating 70
non-conductive epoxy 72

DETAILED DESCRIPTION OF THE INVENTION

FIG. 1 shows a conventional high voltage chip 12 mounted in a cavity 10 of an eight lead plastic dual in line pin package. The chip 12 is electronically attached to bonding pads 14, 16, 18, 20 via bonding leads 22, 24, 26, 28. The bonding pads 14, 16, 18, 20 and bonding leads 22, 24, 26, 28 are used to supply the chip 12 with power, ground, input data, and to receive output data from the chip 12 respectively.

Figure 2:
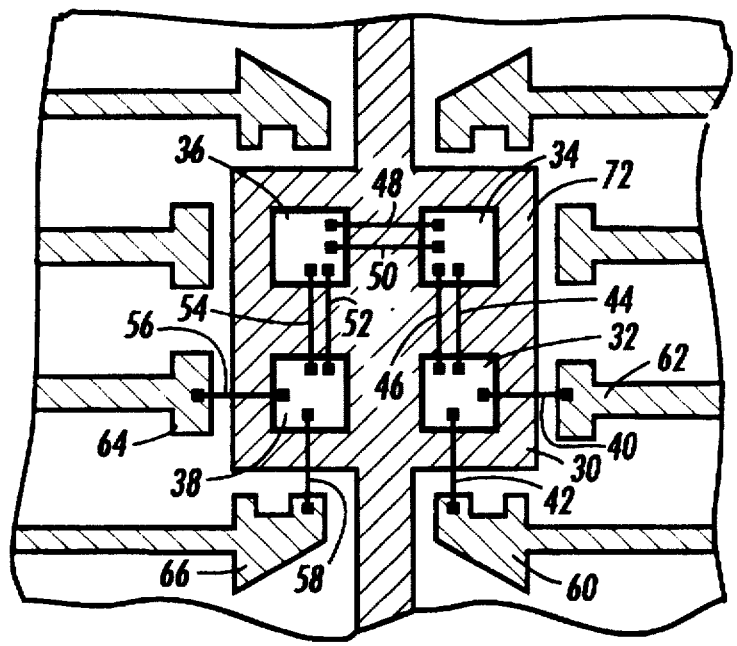
FIG. 2 shows a top view of an array of high voltage devices in a plastic eight pin, dual in line pin package according to the method of this invention.

FIG. 2 shows a top view of a high voltage array of four high voltage chips 32, 34, 36, and 38 mounted in a cavity 30 of a plastic eight lead, dual in line pin package. The chips 32, 34, 36, and 38 are electrically attached to each other to form a single high voltage circuit. Chip 32 receives input data and power on bonding leads 40, 42 respectively. Chip 32 is then electrically connected to chip 34 via bonding leads 44, 46 through which chip 32 passes electrical information to chip 34. Chip 34 is in turn connected to chip 36 through bonding leads 48, 50 and chip 36 is in turn then connected electrically to chip 38 through bonding leads 52, 54. In this example chip 38 is the last chip connected in the array. Chip 38 is then connected to bonding pads 64, 66 through bonding leads 56, 58 respectively. Bonding pad 64 receives output from chip 38 and bonding pad 66 connects chip 38 to ground. It should be noted that although this example of high voltage chips connected in an array contains four chips that any number of chips can be connected to form the high voltage array as long as they are within the constraints of the package pad size.

It should be noted that to achieve the best functionality between the high voltage chips, the individual chips selected should be matched to provide uniform electrical characteristics among the chips. This is necessary because electrical characteristics of individual chips can vary as the process parameters vary during the manufacture of the chips on the wafer. The electrical characteristics matching can be done in either of two ways. The first is to pick individual chips from the same area or region of the wafer. Chips that are in proximity to each other on the wafer will have minimal variance in process conditions and will therefore have reasonably uniform electrical characteristics. The second is to pre-test and qualify the chips on a wafer for their electrical characteristics and then to pick those that match each other to provide a selection of chips with uniform electrical characteristics.

To achieve functionality of multiple high voltage chips within the standard plastic eight pin, dual in line pin package, several additional coatings, not normally used, have been included on the plastic eight pin, dual in line pin package and the chips themselves. The function of these additional coatings is to electrically isolate the individual chips from each other as well as to electrically isolate the individual chips from the lead frame.

The first of the coatings is placed on the cavity 30 of plastic eight pin, dual in line pin package. A non-conductive epoxy 72 is used to coat and secure chips 32, 34, 36, 38 inside the cavity 30. The thickness of the non-conductive epoxy 72 is approximately 5 mils but can vary from 4 mils to 6 mils. The non-conductive epoxy used was Ablestik 84-3J but any commercially available, non-conductive epoxy may be used.

Figure 3:
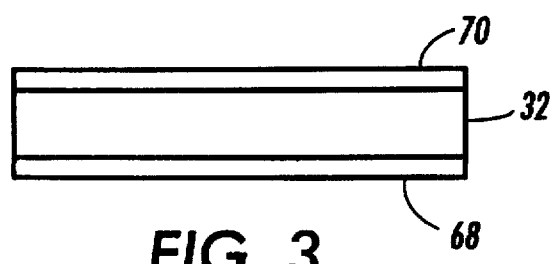
FIG. 3 shows a side view of one of the high voltage devices shown in FIG. 2.

The second of these coatings is a thin layer of polyimide 68 placed on the downward side of each of the chips 32, 34, 36, 38 as shown in FIG. 3. The polyimide 68 is approximately 2.5 mils thick but can vary from 2 mils to 3 mils. The polyimide will come into direct contact with the non-conductive epoxy 72 when the chip is mounted in the cavity 30 and provides additional isolation of the chips 32, 34, 36, 38 from each other. Non-conductive dry films, such as Dupont Pyralux, can also be used in place of the polyimide 68.

The third of these coatings is a die coating 70 of Q1-6646 Hipec Gel die coat material on the upward side of each chip as shown in FIG. 3. The purpose of the die coating 70 is to suppress arcing that may occur either on the surface of a chip or between the chirps 32, 34 36, 38 due to their proximity to each other within the cavity 30. The thickness of the die coating 70 is 4 mils but may vary between 3 mils and 6 mils. While a coating of Q1-6646 Hipec Gel was used, other acceptable coatings with similar properties are available. Hipec Gel is manufactured by Dow Corning and other manufacturers. It is a silicone encapsulant with good dielectric properties in severe environment, particularly environments that are extremely cold. The working temperature range for Hipec Gel is −112 degrees F. to 392 degrees F (−80 degrees C. to 200 degrees C.).

When these three coatings are used in conjunction with an array of high voltage chips, as shown in FIG. 2, operating voltages of 5,000–35,000 volts were sustained in the package in contrast to previous operating voltages of 1000 volts. Because current chip technology is not available to produce chips at operating voltages of greater than 1600 volts stacking chips to obtain circuits operating at higher voltages is the only alternative. Therefore, all package testing has been done using an array of stacked Chips. For example, if a package contains one high voltage chip it should sustain greater than 1600 volts., if a package contains two stacked high voltage chips it should sustain greater than 3200v.

It is essential to use all three coating materials, the polyimide 68, the die coating 70, and the non-conductive epoxy 72 to achieve and sustain the high operating voltages. If even one of the coating materials is missing or defective the voltage sustainable by the packaging drops dramatically and reliability of the parts will be severely downgraded. In testing some defective small 8 lead package, parts containing 3 stacked chips that together should have sustained 5000 volts and survived a life test of 1000 hours at temperatures of 125 degrees centigrade, only sustained 2500 volts and had shorted devices within 72 hours during a life test. In this defective package the polyimide layer was missing causing the failure. It should again be noted that this process is not limited to the small 8 lead package discussed but can be extended larger packages allowing for the stacking of more chips and higher operating voltages.

We claim:

1. A high voltage electronic circuit package comprising
   A) at least two high voltage electronic circuit chips wherein each chip has a top surface and a bottom surface,
   B) the top surface of each high voltage electronic circuit chip being coated with a layer of non-conductive semi-conductor protective coating and the bottom side of each high voltage electronic circuit wafer being coated with a layer of non-conductive film,
   C) a lead frame package with a surface for supporting the at least two high voltage electronic circuit chips,
   D) non-conductive epoxy disposed between and adhered to the non-conductive film on the bottom surfaces of said at least two high voltage electronic circuit wafers and the surface for supporting the at least two high voltage electronic circuit wafers on said lead frame package.

2. The high voltage electronic circuit packaging of claim 1 wherein the non-conductive epoxy is of a thickness of at least 4 mils.

3. The high voltage electronic circuit packaging of claim 1 wherein the non-conductive film is of a thickness of at least 2 mils.

4. The high voltage electronic circuit packaging of claim 1 wherein the non-conductive semiconductor protective coating is of a thickness of at least 3 mils.

5. The high voltage electronic circuit packaging of claim 1 wherein the non-conductive semiconductor protective coating is of a thickness of at least 3 mils, the non-conductive epoxy is of a thickness of at least 4 mils, and the non-conductive film is of a thickness of at least 2 mils.

6. The high voltage electronic circuit packaging of claim 5 wherein the non-conductive semiconductor protective coating comprises silicon and the non-conductive film comprises polyimide.

7. The high voltage electronic circuit packaging of claim 1 wherein the non-conductive epoxy is of a thickness of between 4 mils and 6 mils.

8. The high voltage electronic circuit packaging of claim 1 wherein the non-conductive film is of a thickness of between 2 mils and 3 mils.

9. The high voltage electronic circuit packaging of claim 1 wherein the non-conductive semiconductor protective coating is of a thickness of between 3 mils and 6 mils.

10. The high voltage electronic circuit packaging of claim 1 wherein the non-conductive semiconductor protective coating is of a thickness of between 3 mils and 6 mils, the non-conductive epoxy is of a thickness of between 4 mils and 6 mils, and the non-conductive film is of a thickness of between 2 mils and 3 mils.

11. The high voltage electronic circuit packaging of claim 10 wherein the non-conductive semiconductor protective coating comprises silicon and the non-conductive film comprises polyimide.

12. The high voltage electronic circuit packaging of claim 1 wherein the non-conductive semiconductor protective coating comprises silicone.

13. The high voltage electronic circuit packaging of claim 1 wherein the non-conductive film comprises polyimide.

* * * * *